(12) United States Patent
Liu et al.

(10) Patent No.: US 6,432,798 B1
(45) Date of Patent: Aug. 13, 2002

(54) EXTENSION OF SHALLOW TRENCH ISOLATION BY ION IMPLANTATION

(75) Inventors: Mark Y. Liu, Portland; Leonard C. Pipes, Beaverton; Mitchell C. Taylor, Lake Oswego, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/636,297

(22) Filed: Aug. 10, 2000

(51) Int. Cl.$^7$ ............................................... H01L 21/76
(52) U.S. Cl. ...................... 438/433; 438/296; 438/424; 438/440
(58) Field of Search ................................ 438/296, 433, 438/424, 425, 297, 439, 440

(56) References Cited

U.S. PATENT DOCUMENTS

| | | | | |
|---|---|---|---|---|
| 4,683,637 A | * | 8/1987 | Varker et al. | 438/296 |
| 4,700,454 A | * | 10/1987 | Baerg et al. | 438/297 |
| 5,212,397 A | * | 5/1993 | See et al. | 257/347 |
| 5,445,989 A | * | 8/1995 | Lur et al. | 438/433 |
| 5,733,813 A | * | 3/1998 | Chen et al. | 438/440 |
| 5,783,476 A | * | 7/1998 | Arnold | 438/425 |
| 5,940,718 A | * | 8/1999 | Ibok et al. | 438/440 |
| 5,976,952 A | * | 11/1999 | Gardner et al. | 438/440 |
| 6,066,530 A | * | 5/2000 | Templeton et al. | 438/257 |
| 6,146,973 A | * | 11/2000 | He et al. | 438/433 |
| 6,245,639 B1 | * | 6/2001 | Tsai et al. | 438/433 |
| 6,284,626 B1 | * | 9/2001 | Kim | 438/440 |

FOREIGN PATENT DOCUMENTS

| | | | | |
|---|---|---|---|---|
| EP | 00595233 A2 | * | 4/1994 | H01L/21/76 |
| JP | 404037152 A | * | 2/1992 | H01L/21/76 |

* cited by examiner

Primary Examiner—Olik Chaudhuri
Assistant Examiner—David S. Blum
(74) Attorney, Agent, or Firm—Blakely, Sokoloff, Taylor & Zafman LLP

(57) ABSTRACT

A shallow trench isolation (STI) structure is formed by etching trenches into the surface of a substrate in alignment with a patterned masking layer. An ion implantation of, for example, carbon, nitrogen, or oxygen, is performed so as to create an electrically insulating layer extending downwardly from a bottom surface of the trench. By implanting such extensions, STI structures with greater effective aspect ratios may be obtained which, in turn, allow greater packing density in integrated circuits. Implanted isolation structures may be formed without etching a trench by implanting into regions of the substrate. In this way, trench etch, dielectric back-fill, and planarization operations can be eliminated. Furthermore the implanted regions may be formed by multiple implants at different energies so as to obtain multiple, typically contiguous, target ranges. Ions of various masses or charges may be used so as to obtain the desired implant depth and concentration profile in the isolation structures, independent of whether these structures are trench extensions or formed directly beneath a planarized substrate surface.

25 Claims, 3 Drawing Sheets

EXTENSION OF SHALLOW TRENCH ISOLATION BY ION IMPLANTATION

BACKGROUND OF THE INVENTION

1. Field of the Invention

The present invention relates generally to the field of integrated circuit manufacturing, and more specifically, to methods and structures for providing isolation between circuit elements.

2. Background

Advances in semiconductor manufacturing technology have led to the integration of millions of transistors onto a single integrated circuit (IC). In order to reach these levels of integration all the elements that go into such an IC must be shrunk. It is well known in the field of integrated circuit manufacturing that it is desirable to reduce the size of the transistors and interconnect lines that make up the bulk of an integrated circuit. However, modem metal-oxide-semiconductor (MOS) integrated circuits have also addressed the design and implementation of isolation structures to increase the density of ICs.

The state of the art isolation scheme in manufacturing of integrated circuits is to use shallow dielectric trenches to electrically separate neighboring transistors. Trenches are fabricated by a sequence of etching the silicon substrate, filling the trench with dielectric material, and planarization of the entire substrate by chemical mechanical polishing. The isolation performance of the shallow-trench isolation directly depends on the trench depth. Generally, the deeper the trenches, the better the isolation. However, as the packing density continues to increase, the lateral dimension of the trenches continues to decrease in ultra-large-scale integrated circuits. In order to achieve a manufacture-worthy process, the aspect ratio of the trenches, and therefore the depth of the trenches, is limited due to the limitations of the trench etching, filling, and polishing operations. This in turn compromises the isolation performance, and imposes an extra limitation to the process development.

Accordingly, there is a need for methods and structures to improve circuit density while maintaining appropriate electrical isolation between circuit elements.

DETAILED DESCRIPTION

Methods and structures for improved density in integrated circuits are described herein. In the following description numerous specific details are set forth to provide an understanding of the present invention. It will be apparent, however, to those skilled in the art and having the benefit of this disclosure, that the present invention may be practiced with apparatus and processes that vary from those of the illustrative examples provided herein.

Terminology

The terms, chip, integrated circuit, monolithic device, semiconductor device or component, microelectronic device or component, and similar terms and expressions, are often used interchangeably in this field. The present invention is applicable to all the above as they are generally understood in the field.

Isolation structures of various forms have been used for many years in the manufacture of integrated circuits. Shallow trench isolation (STI) structures mentioned above are one such arrangement. Previously developed isolation structures, often referred to as "field oxide" or "LOCOS (LOCalized Oxidation of Silicon)" structures have similar functionality to the STI structures but do not offer the same packing density achievable with STI.

Some numerical values herein are given in a scientific notation format including."EX" where E represents the base ten, and X represents the exponent of the base ten.

Atomic mass unit is referred to herein with the acronym AMU.

Overview

Embodiments of the present invention provide a shallow trench isolation structure which has greater depth, and therefore greater ability to perform its role as an electrical isolation structure, than is possible with conventional processes. More particularly, a shallow trench isolation (STI) structure is formed by etching one or more trenches into the surface of a substrate, in alignment with a patterned masking layer. For substrates such as silicon wafers, an ion implantation of, for example, carbon, nitrogen, or oxygen, is performed so as to create an electrically insulating layer extending downwardly from a bottom surface of the trench. By implanting such extensions, STI structures with greater effective aspect ratios may be obtained which, in turn, allow greater packing density in integrated circuits.

Figure 1:
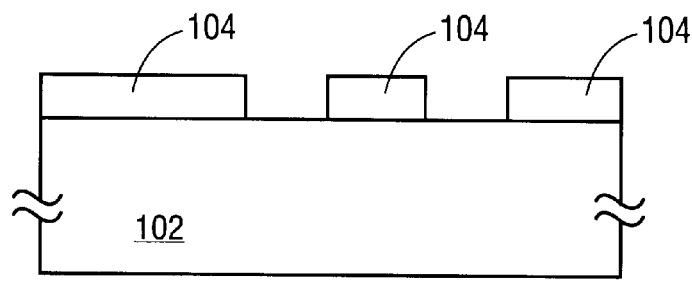
FIG. 1 is a schematic cross-sectional view of a partially processed wafer having a patterned masking thereon.

Referring now to FIG. 1, a partially processed wafer is shown which includes a silicon substrate 102, and a patterned masking layer 104. Openings in patterned masking layer 104 expose corresponding underlying regions of silicon substrate 102. Masking layer 104 may be formed from a material such as silicon nitride which provides the selectivity necessary to etch silicon substrate 102 without damaging masking layer 104 to the extent that the defined pattern is substantially changed. Alternatively, masking layer 104 may be formed of photoresist, or combination of a nitride layer and photoresist patterned so as to form the appropriate openings for trench etching. The main process design consideration is that the cumulative thickness of all masking layers (for example, photoresist, nitride, and/or pad oxide) needs to be sufficient to block the STI extension implant at the target energy that will be made into the bottom of the trenches in substrate 102 which are formed in accordance with masking layer 104.

Figure 2:
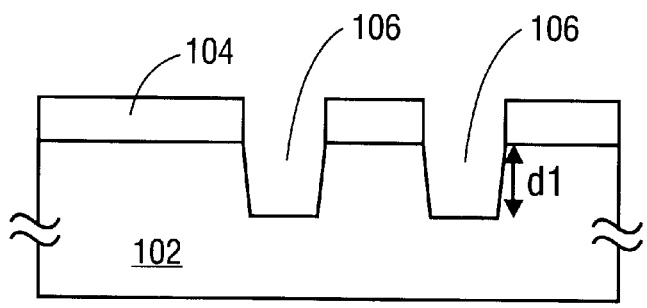
FIG. 2 is a schematic cross-sectional view of the structure of FIG. 1, after the exposed surface of the wafer is exposed to an etching operation thereby forming trenches.

FIG. 2 shows the structure of FIG. 1, after the exposed portions of silicon substrate 102 are etched to form trenches 106. As indicated in the figure, the trenches are etched to a depth $d_1$. In the illustrative embodiment trenches 106 are typically etched to a depth of between 2000 and 5000 angstroms. However, the invention is essentially independent of the depth to which the trench is etched because ion implantation is as close to a "perfectly anisotropic" (singly-directional) process as currently exists in semiconductor manufacturing. However, upon entering the silicon, some lateral movement of the implanted species does occur. In general the lateral straggle, as this movement is referred to, is roughly equal to ½ the projected range Rp (see projected range estimates below). In view of the lateral straggle phenomenon, it is preferable that the projected range should be selected such that the STI extension does not overlap source/drain or channel regions that are subsequently formed in the substrate as part of the fabrication of MOS transistors. In this way, the STI extension implants do not adversely affect the electrical properties of the subsequently formed transistors. It should be noted that overlap of the STI extension implants with the regions that form active devices may be acceptable as long as the electrical properties of the subsequently formed transistors acceptable to the manufacturer. On the other hand, lateral straggle below the regions in which the source/drains are formed have the advantage of reducing the junction capacitance in the same way (but to a far lesser extent) that silicon-on-insulator (SOI) does.

Figure 3:
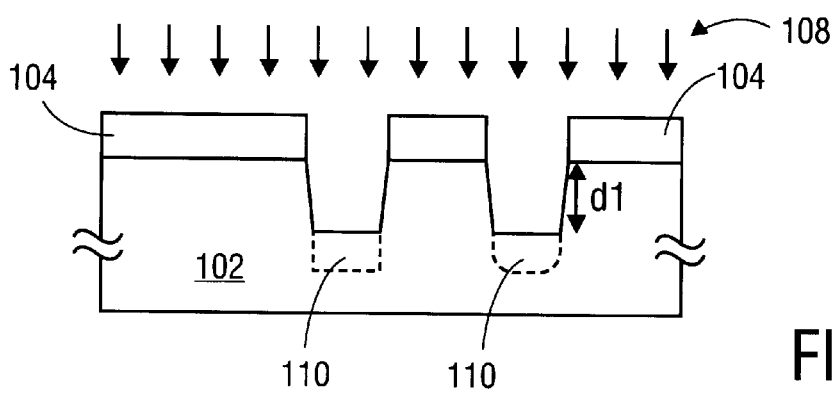
FIG. 3 is a schematic cross-sectional view the structure of FIG. 2, after an ion implant operation is used to provide a doped region underlying the trenches.

Referring now to FIG. 3, after trenches 106 are formed, a plurality of ions 108 are implanted into silicon substrate 102 in alignment with patterned masking layer 104. It is preferable that masking layer 104 be thick enough to substantially prevent ions 108 from reaching silicon substrate 102 except for the regions exposed by the openings in masking layer 104. Ion implantation methods and apparatus are well known in the field of semiconductor manufacturing and will not be discussed in detail herein. The implanted ions form doped regions 110 of silicon substrate 102 that acts as an extension of the trench isolation structure. Ions such as, but not limited to, carbon, nitrogen, or oxygen may be implanted so as to form doped regions 110. Doped regions 110 may also be referred to trench extensions, shallow trench isolation structure extensions, or similar word combinations designed to convey the meaning of increasing the effective depth of a trench isolation structure. In one embodiment of the invention, Nitrogen 28+ (i.e., $N_2$+) may be implanted at a dose in the range of 1.0E13–1.5E17 atoms/cm$^2$ with an energy in the range of 5–200 keV (lower energy preferred). Implanting $N_2$+ (28 AMU) into a silicon substrate at a dose of between 1.0E16–1.0E17 and an energy of 20 keV would produce silicon nitride films about 200–300 angstroms thick. In some embodiments of the invention, multiple implants at different energies can be used to extend the depth of the implanted extension with overlapping profiles. Oxygen 32+ or O16+ (i.e., $O_2$+ or O+) implanted at a dose in the range of 1.0E14–5.0E16 atoms/cm$^2$ with an energy of in the range of 5–200 keV may be used in other embodiments of the invention. This is in contradistinction to conventional implants for the production of silicon on insulator (SOI) which tend to be very high dose (i.e., high E16 to E18), and which are generally blanket implants rather than implants into particular areas of the substrate. Examples of species, dose, energy, and depth of trench extension are given in Table I below.

TABLE I

| Species | | Dose | Energy | Depth (Rp) |
| --- | --- | --- | --- | --- |
| $N_{2+}$ | (28 AMU) | 5E17 | 20 keV | ~300 Angstroms |
| $N_2$+ | (28 AMU) | 5E14 | 200 keV | ~3000 Angstroms |
| $N_2$+ | (28 AMU) | 2E17 | 60 keV | ~800 Angstroms |

TABLE I-continued

| Species | | Dose | Energy | Depth (Rp) |
| --- | --- | --- | --- | --- |
| N+ | (14 AMU) | 5E14 | 200 keV | ~6000 Angstroms |
| $O_2$+ | (32 AMU) | 1E18 | 30 keV | ~300 Angstroms |
| O+ | (16 AMU) | 8E17 | 40 keV | ~1500 Angstroms |
| C+ | (12 AMU) | 2E17 | 10 keV | ~300 Angstroms |
| C+ | (12 AMU) | 2E14 | 200 keV | ~6000 Angstroms |

The choice between implanting nitrogen, oxygen, or carbon, to from respectively a nitride, oxide, or carbide region in the substrate, is based upon the balance between achievable beam current at target energies using existing ion implantation technology; miscellaneous tool considerations (e.g., contamination, unwanted chemistry within the implanter, excessive parts wear, particle performance, etc.); and tolerance to stress induced by the implanted insulator. SiN, SiC and SiO all have different lattice constants resulting in different amounts of stress (which in turn cause defects and alter electron mobility). Stress tradeoffs may be integrated with the STI extension regions "line tune" the mechanical stresses introduced by such processes. In particular, stacking fault generation at SiN boundaries would be a significant concern since these defects tend to cause electrical leakage paths. In presently preferred embodiments, reduced implant doses (i.e., doses such that the implanted oxygen, nitrogen, or carbon ratio is less than "stoichiometric" oxide, nitride, or carbide concentration) are desired in that they are faster, cheaper, and less likely to cause leakage paths via dislocations, or faults. However, the use of brute-forcing the STI trench via high-dose implants to create "true" insulating films are not precluded.

For the projected species, doses and energies, described above channeling should not present any issues for implementation of the present invention. Channeling is typically hard to control and often leads to within-wafer uniformity issues with even the latest implant technology. However, using a traditional tilt/twist anti-channeling scheme are not generally useful for embodiments of the present invention because these can lead to trench-sidewall shadowing issues.

Figure 4:
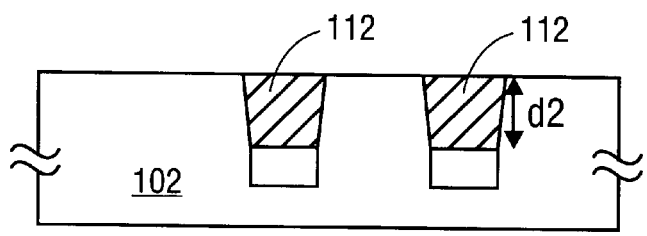
FIG. 4 is a schematic cross-sectional view of the structure of FIG. 3, after the masking layer is removed and the trenches are filled with dielectric material.

FIG. 4 shows the structure of FIG. 3, after masking layer 104 is removed and trenches 106 are filled with a dielectric material 112. Dielectric material 112 is typically an oxide of silicon. However, those skilled in the art will recognize that trenches 106 may be filled with one or more dielectric materials. By way of example and not limitation, trenches 106 may also be filled with combinations of silicon oxide, silicon nitride, silicon oxynitride, or other dielectric materials suitable for integration into semiconductor manufacturing processes. An annealing operation (i.e., a high temperature operation) may be performed to activate the implanted dopants. This high temperature operation may be done specifically to activate the trench extension dopants, however it is preferable to rely on other high temperature operations, such as those that occur during the formation of gate dielectric layers or activation of source/drain implants, to also activate the trench extension dopants.

Still referring to FIG. 4, it can be seen that the effective depth of the trench isolation structure is shown by $d_2$. Embodiments of the present invention extend the depth of the trench isolation structure by implanting material through the bottom surface of the trench so as form a dielectric region subjacent that bottom surface. In this way, the trench isolation structures can be made deeper than is practical by the conventional method of etching and then back-filling a trench.

By using the trench etch masking layer as the implant mask, and further relying on one or more of the other high temperature operations common in semiconductor manufacturing processes, embodiments of the present invention can be implemented by adding only the trench extension implant.

Figure 5:
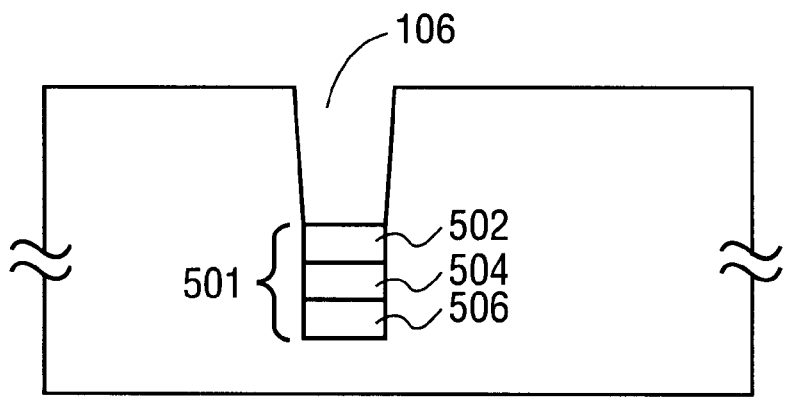
FIG. 5 is a schematic cross-sectional view of a partially processed wafer having a trench formed therein and three levels of extension.

Referring now to FIG. 5, an alternative embodiment of the present invention is illustrated wherein three implanted regions 502, 504, 506 are formed beneath trench 106. Together, implanted regions 502, 504, 506 form trench extension 501. Although, referred to as trench extension 501, it should be noted that this is an isolation structure on its own, whether or not trench 106 is back-filled with dielectric material. In the illustrated embodiment implanted regions 502, 504, 506 are formed by implanting the same species three times with three different energies to obtain three different projected ranges Rp. By implanting at different energies, it is possible to obtain deeper extensions by essentially superimposing several implant profiles on top of each other. It should be noted that three regions are used for purposes of illustration and not limitation. Embodiments of the present invention may have more or fewer than three implanted regions. Furthermore, the implanted regions can be formed from different implanted species. When different species (i.e., ions) are used, the implant energy may be adjusted accordingly so as to properly target the Rp of that species.

Figure 6:
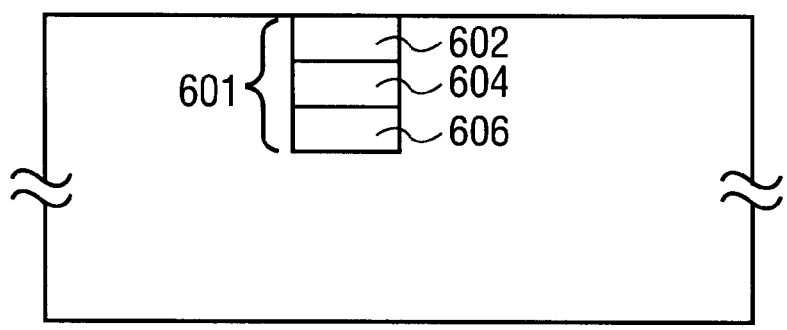
FIG. 6 is a schematic cross-sectional view of a partially processed wafer having an isolation structure formed therein by three level of implanted ions.

Referring now to FIG. 6, a further alternative embodiment of the present invention is illustrated. In this illustrative embodiment, implanted regions 602, 604, 606 are formed by implanting the same species three times with three different energies to obtain three different projected ranges Rp. As noted above, by implanting at different energies, it is possible to obtain deeper extensions by essentially superimposing several implant profiles on top of each other. However, unlike the embodiment of FIG. 5, the embodiment of FIG. 6, shows that no trench is necessary to form implanted regions 602, 604, 606, which together comprise an isolation structure 601. It should be noted that three regions are used for purposes of illustration and not limitation. Embodiments of the present invention may have more or fewer than three implanted regions. Furthermore, the implanted regions can be formed from different implanted species. When different species (i.e., ions) are used, the implant energy may be adjusted accordingly so as to properly target the Rp of that species. An advantage of this approach is that the trench etching operation, and deposition operation, by which dielectric back-filling of the trench is accomplished, can be eliminated. Furthermore, by eliminating the dielectric deposition, it becomes unnecessary to perform a polishing operation to remove the excess dielectric material and return the wafer surface to a high level of planarity. This polishing, or planarization, is typically achieved by chemical mechanical polishing and requires expensive consumables such as slurries, so eliminating these manufacturing steps in the formation of the isolation structures can be advantageous.

Figure 7:
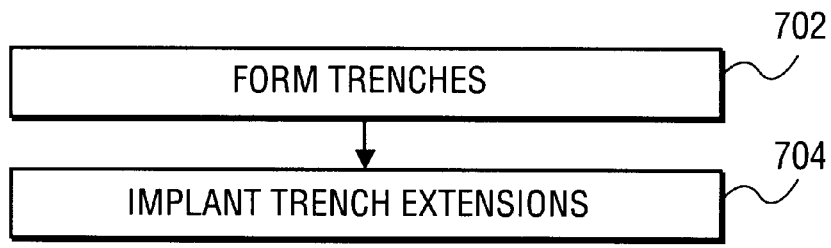
FIG. 7 is a flowchart showing the operations of a process in accordance with the present invention.

FIG. 7 illustrates a process in accordance with the present invention. As shown in the figure, trenches are formed 702. These are typically formed in the surface of a substrate such as, but not limited to, a silicon wafer. After the trenches are formed, typically by plasma etching, trench extensions are formed by ion implantation 704. Those skilled in the art will recognize that the plasma etch conditions may vary depending on the materials which comprise the substrate and the mask used to define the trench areas. The ion implantation is typically aligned to the trenches by the same mask used to define the areas of the substrate to be etched to form trench openings. The trench extensions are electrically insulating (in contradistinction to the semiconducting nature of the surrounding material of the substrate).

Figure 8:
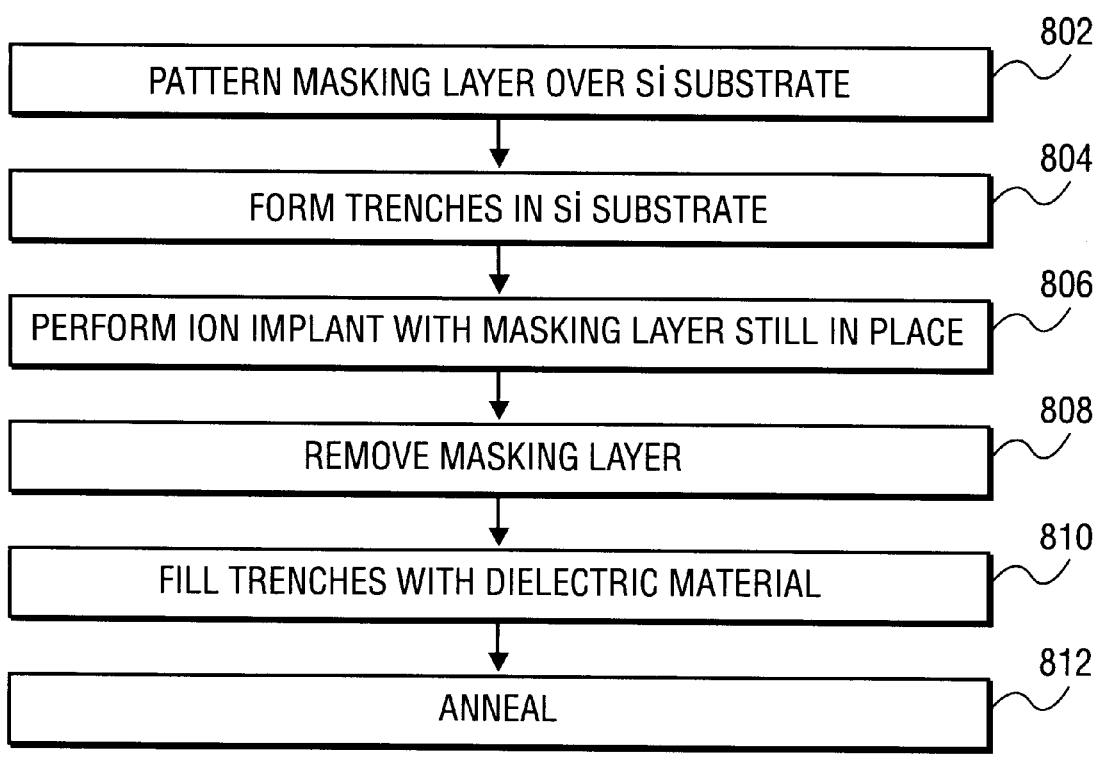
FIG. 8 is a flowchart showing the operations of a process in accordance with the present invention.

FIG. 8 also illustrates a process in accordance with the present invention. As shown in the figure, a patterned masking layer is formed over the surface of a silicon substrate 802. The pattern has openings which expose portions of the underlying substrate. The exposed portions of the substrate are etched, typically in a plasma etcher, to form trenches 804. The trenches may also be thought of as recesses in the surface of the substrate. Without removing the masking layer, an ion implant operation is performed to create the trench extensions 806. The patterned masking layer which protected portions of the surface from being etched is also used to block the ion implant. The implanted species is chosen such that it will form an electrically insulating structure below the trench. For a silicon substrate, the implanted species may be selected from the group consisting of oxygen, nitrogen, or carbon. However, any material may be implanted which will produce the desired non-conductive portion subjacent the trench. Subsequently, the masking layer is removed 808. The trenches are then filled 810. An annealing, that is, high temperature, operation is then performed 812. Typical annealing temperatures and ambients vary depending on the materials used. In one embodiment, where the substrate is a single crystal silicon wafer, and a nitride extension is implanted at 20 keV with a 1.0E17 dose, the extension the post-anneal depth would be approximately 200–600 angstroms, and the anneal can be approximately 30 minutes at approximately 950° C. The definition of extension depth is somewhat difficult in that there is a graded profile, nitride in this case, where the interface would extend from $10^{22}$ atoms/cm$^3$ to $10^{19}$ atoms/cm$^3$ over a 200 angstrom range. However, regardless of definition, the projected range is 250–300 angstroms.

CONCLUSION

Embodiments of the present invention provide a shallow trench isolation structure which has greater depth, and therefore greater ability to perform its role as an electrical isolation structure, than is possible with conventional processes.

An advantage of some embodiments of the present invention is that the extension can be easily changed by changing the energy of the ion implantation.

An further advantage of some embodiments of the present invention is that the extended dielectric portion is slightly wider than the bottom of the trench because of the lateral straggle of ion implantation, which can provide better electrical isolation.

A still further advantage of some embodiments of the present invention is that these are cost-effective because they only require one extra ion implantation step, while the required thermal annealing may happen in a later process step such as, for example, gate anneal, or source/drain anneal which are performed in any case.

It will be apparent to those skilled in the art that a number of variations or modifications may be made to the illustrative embodiments described above. For example, various implant species and energies may be used within the scope of the present invention. Similarly, different substrate materials, including but not limited to silicon on insulator (SOI), epi wafers, and wafers formed by bonding two or more thinner wafers into one thicker wafer.

Other modifications from the specifically described methods and structures will be apparent to those skilled in the art and having the benefit of this disclosure. Accordingly, it is intended that all such modifications and alterations be considered as within the spirit and scope of the invention as defined by the subjoined Claims.

What is claimed is:

1. A method of forming a shallow trench isolation structure, comprising:

forming a trench in a substrate;

implanting ions into at least a bottom portion of the trench, said ions of a dosage strength to produce a compound of less than stoichiometric concentration;

filling the trench with dielectric material; and performing a high temperature operation on the substrate.

2. The method of claim 1, wherein the substrate is a silicon wafer, and forming the trench comprises patterning a mask layer on a surface of the silicon wafer such that at least one portion of the surface is exposed, and etching the at least one exposed portion of the silicon surface.

3. The method of claim 2, wherein implanting ions comprises implanting oxygen.

4. The method of claim 2, wherein implanting ions comprises implanting nitrogen.

5. The method of claim 2, further comprising removing the patterned mask layer subsequent to implanting ions.

6. The method of claim 4, further comprising annealing the wafer.

7. The method of claim 5, further comprising annealing the wafer.

8. The method of claim 5, wherein implanting ions comprises implanting a first species at a first energy and a first dose, and implanting a second species at a second energy and a second dose.

9. The method of claim 8, wherein the first species has a projected range and the second species has a projected range and the projected ranges are different.

10. The method of claim 9, wherein at least one of the first and second species is nitrogen.

11. A method of forming a shallow trench isolation structure, comprising:

depositing a silicon nitride layer on a surface of a silicon wafer;

photolithographically patterning the silicon nitride layer to form openings therethrough;

plasma etching the surface of the silicon through the openings in the silicon nitride layer to form a plurality of recesses in the surface of the wafer, each recess having sidewalls and a bottom surface;

implanting ions through the bottom surface of the recesses, said ions of a dosage strength to produce a compound of less than stoichiometric concentration; and performing a high temperature operation on the substrate.

12. The method of claim 11, wherein the ions are selected from the group consisting of carbon, nitrogen, and oxygen.

13. The method of claim 11, wherein implanting comprises implanting oxygen at a dose in the range of 1.0E14 to 5.0E16 atoms/cm$^2$, and at an energy in the range of 5 keV to 200 keV.

14. The method of claim 11, wherein implanting comprises implanting nitrogen at a dose in the range of 1.0E13 to 1.5E17 atoms/cm$^2$, and at an energy in the range of 5 keV to 200 keV.

15. A method of forming an isolation structure in a semiconductor substrate, comprising:

implanting a first plurality of ions into at least one region of the substrate, the first plurality ions being implanted with a first energy to produce a first target range, said first plurality of ions of a dosage strength to produce a compound of less than stoichiometric concentration; and implanting a second plurality of ions into the at least one region of the substrate, the second plurality ions being implanted with a second energy to produce a second target range.

16. The method of claim 15, wherein the first ions and the second ions are the same.

17. The method of claim 15, wherein the first ions and the second ions are different.

18. The method of claim 16, wherein the first target range and the second target range are the same.

19. The method of claim 17, wherein the first target range and the second target range are different.

20. The method of claim 16, wherein the first ions are selected from the group consisting of oxygen, nitrogen, and carbon.

21. The method of claim 17, wherein the first ions are selected from the group consisting of oxygen, nitrogen, and carbon.

22. A method of forming an isolation structure in a substrate, comprising:

forming a trench in the substrate;

implanting a first plurality of ions at a first energy into the trench, said first plurality of ions of a dosage strength to produce a compound of less than stoichiometric concentration; and implanting a second plurality of ions at a second energy into the trench;

wherein the first implanted ions and the second implanted ions have different target ranges.

23. The method of claim 22, further comprising implanting a third plurality of ions at a third energy into the trench, wherein the third implanted ions have a target range that is different from the target ranges of the first and second implanted ions.

24. The method of claim 22, wherein the first and second plurality of ions are different elements.

25. The method of claim 23, wherein the first and second plurality of ions are the same elements.

* * * * *

UNITED STATES PATENT AND TRADEMARK OFFICE
CERTIFICATE OF CORRECTION

PATENT NO.    : 6,432,798 B1                                           Page 1 of 1
DATED         : August 13, 2002
INVENTOR(S)   : Liu et al.

It is certified that error appears in the above-identified patent and that said Letters Patent is hereby corrected as shown below:

Column 4,
Line 21, delete "line" and insert -- fine --.

Signed and Sealed this

Seventh Day of September, 2004

JON W. DUDAS
*Director of the United States Patent and Trademark Office*